United States Patent
Hirose

(10) Patent No.: US 8,144,476 B2
(45) Date of Patent: Mar. 27, 2012

(54) HOUSING FOR IN-VEHICLE ELECTRONIC CONTROL UNIT

(75) Inventor: Yoshinori Hirose, Toyota (JP)

(73) Assignee: Denso Corporation, Kariya (JP)

( * ) Notice: Subject to any disclaimer, the term of this patent is extended or adjusted under 35 U.S.C. 154(b) by 199 days.

(21) Appl. No.: 12/657,419

(22) Filed: Jan. 19, 2010

(65) Prior Publication Data

US 2010/0182757 A1      Jul. 22, 2010

(30) Foreign Application Priority Data

Jan. 20, 2009   (JP) ................. 2009-009854

(51) Int. Cl.
    *H05K 5/00* (2006.01)
(52) U.S. Cl. ......... 361/752; 361/730; 361/796; 361/800
(58) Field of Classification Search .................. 361/752, 361/796, 800, 807, 810, 728–730, 797; 312/223.1–223.3
    See application file for complete search history.

(56) References Cited

U.S. PATENT DOCUMENTS

| | | | |
|---|---|---|---|
| 4,392,701 A | * | 7/1983 | Weidler ............... 439/76.1 |
| 4,781,600 A | * | 11/1988 | Sugiyama et al. ........... 439/45 |
| 5,008,487 A | * | 4/1991 | Shimmyo ............... 174/373 |
| 5,097,978 A | * | 3/1992 | Eckerd ............... 220/315 |
| 6,728,110 B2 | | 4/2004 | Koyama |
| 6,816,381 B2 | * | 11/2004 | Takeuchi ............... 361/752 |
| 7,147,486 B2 | * | 12/2006 | Clark ............... 439/76.1 |
| 7,245,497 B2 | * | 7/2007 | Klein et al. ............... 361/752 |
| 7,510,404 B2 | * | 3/2009 | Koyama ............... 439/76.1 |

FOREIGN PATENT DOCUMENTS

| | | |
|---|---|---|
| EP | 1 887 842 | 2/2008 |
| JP | 11-284374 | 10/1999 |
| JP | 2002-308021 | 10/2002 |

* cited by examiner

*Primary Examiner* — Hung S Bui
(74) *Attorney, Agent, or Firm* — Harness, Dickey & Pierce, PLC

(57) ABSTRACT

A box-shaped housing of an in-vehicle electronic control unit that controls an occupant crash protection system is installed to an installation surface of a vehicle and includes an opening end that defines an opening in an imaginary plane, a ceiling wall, and a peripheral wall. The housing receives a planar control circuit board of the control unit through the opening end toward the ceiling wall and securely holds the circuit board at the peripheral wall such that a plane of the circuit board is parallel to the imaginary plane. The peripheral wall includes an opening side wall section located adjacent to the opening end, and a ceiling side wall section having a thickness larger than a thickness of the opening side wall section.

5 Claims, 9 Drawing Sheets

PREDETERMINED DIRECTION

HOUSING FOR IN-VEHICLE ELECTRONIC CONTROL UNIT

CROSS REFERENCE TO RELATED APPLICATION

This application is based on and incorporates herein by reference Japanese Patent Application No. 2009-9854 filed on Jan. 20, 2009.

BACKGROUND OF THE INVENTION

1. Field of the Invention

The present invention relates generally to a housing for an in-vehicle electronic control unit, which is a box-shaped housing for an electronic control unit that is used for an occupant crash protection such as an air bag for protecting an occupant when a vehicle collides, and more particularly to a housing for an in-vehicle electronic control unit that protects a control circuit board disposed in a housing when a vehicle collides.

2. Description of Related Art

Conventionally, as a housing for an in-vehicle electronic control unit such as the above-described type, there is a housing for an electronic device described in JP-A-2008-41718 (corresponding to EP1,887,842A1). As shown in FIG. 10, a housing 100 is a housing of an electronic control unit (ECU) of a vehicle, and includes a base 30 and a case 20 that accommodate a circuit board 10, on which an electronic component 12 is mounted. The housing 100 is attached to an attachment body (not shown) such as a vehicle. The base 30 is formed by pressing aluminum, and includes a holding part 31, an attachment portion 33, and a joining part 36. The circuit board 10 is fixed onto the holding part 31. The attachment portion 33 is screwed to the attachment body and has a through hole 34 through which a screw passes. The joining part 36 connects the holding part 31 and the attachment portion 33. At least one of the attachment portion 33 and the joining part 36 serves as a stress absorption part for absorbing stress produced by the attachment body.

Accordingly, by at least one of the attachment portion 33 and the joining part 36 functioning as the stress absorption part for absorbing stress produced by the attachment body, transmission of the stress produced by the attachment body to the circuit board 10 is limited.

However, in the above-described publication JP-A-2008-41718, if the electronic device housing 100 is damaged after the housing 100 cracks due to deformation of the vehicle when the vehicle collides, for example, the circuit board 10 is also damaged or, the case 20 cracks and rain water or radiator liquid, for example, enters through this crack. As a result, the circuit board 10 is submerged, so that the electronic component 12 mounted on the circuit board 10 is damaged.

For instance, stored data at the time of the collision is retrieved from a storage device of the ECU so as to analyze the collision. Nevertheless, when the circuit board 10 is damaged as above, the analysis of the collision by retrieving the stored data at the time of the collision from the storage device mounted on the circuit board 10 cannot be carried out. Furthermore, if the electronic device housing 100 is damaged, a power source line is short-circuited so as to catch fire, so that a vehicle fire may be caused.

SUMMARY OF THE INVENTION

The present invention addresses at least one of the above disadvantages.

According to the present invention, there is provided a box-shaped housing of an in-vehicle electronic control unit that controls an occupant crash protection system, which protects an occupant of a vehicle in a case of collision of the vehicle. The box-shaped housing is adapted to be installed to an installation surface of the vehicle and includes an opening end, a ceiling wall, and a peripheral wall. The opening end defines an opening in an imaginary plane and is adapted to be placed adjacent to the installation surface of the vehicle. The ceiling wall is opposed to the opening end in a predetermined direction, which is generally perpendicular to the imaginary plane. The peripheral wall extends from the opening end to the ceiling wall in the predetermined direction. The box-shaped housing is adapted to receive a planar control circuit board of the in-vehicle electronic control unit through the opening end toward the ceiling wall in the predetermined direction and is adapted to securely hold the planar control circuit board at the peripheral wall such that a plane of the planar control circuit board is generally parallel to the imaginary plane. The peripheral wall includes an opening side wall section and a ceiling side wall section. The opening side wall section is located adjacent to the opening end. The ceiling side wall section has a wall thickness larger than a wall thickness of the opening side wall section and is located on a ceiling wall side of the opening side wall section, which is opposite from the opening end in the predetermined direction.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Figure 1A:
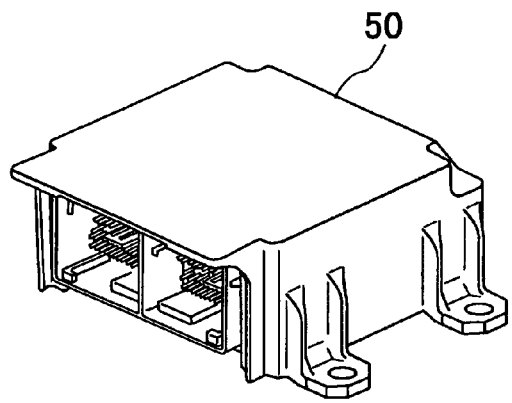
FIG. 1A is a perspective view illustrating an electronic control unit in accordance with an embodiment of the invention.
Figure 1B:
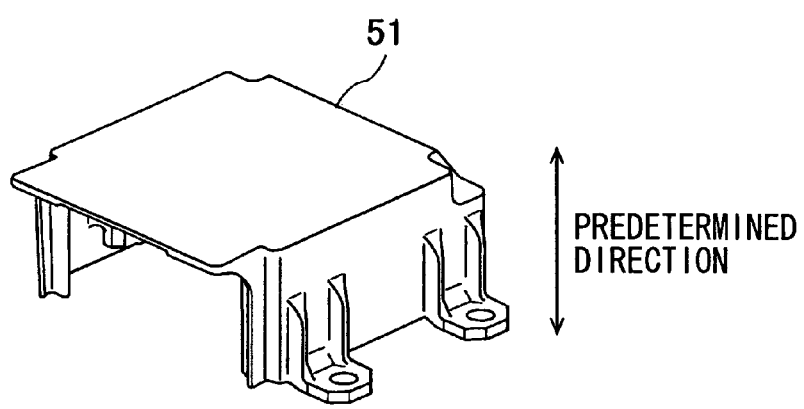
FIG. 1B is a perspective view illustrating an housing case of the electronic control unit in accordance with the embodiment.
Figure 1C:
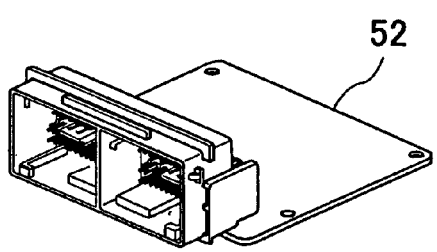
FIG. 1C is a perspective view illustrating a control circuit board of the electronic control unit in accordance with the embodiment.
Figure 1D:
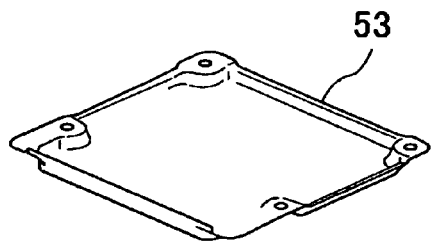
FIG. 1D is a perspective view illustrating a housing cover of the electronic control unit in accordance with the embodiment.

An embodiment of the invention will be described below with reference to the accompanying drawings. The same numerals are used to indicate components that correspond to each other in the drawings of the embodiment, and description of the corresponding component is omitted on a timely basis to avoid repetition.

An electronic control unit (ECU) 50 illustrated in FIGS. 1A to 1D includes a housing case 51, a control circuit board 52, and a housing cover 53. The housing case 51 has a shape of a box that opens on its lower side. The control circuit board 52 is inserted into the housing case 51 through an opening of the case 51 and fixed thereto. The housing cover 53 is fixed to the opening of the housing case 51 to cover this opening.

Figure 2:
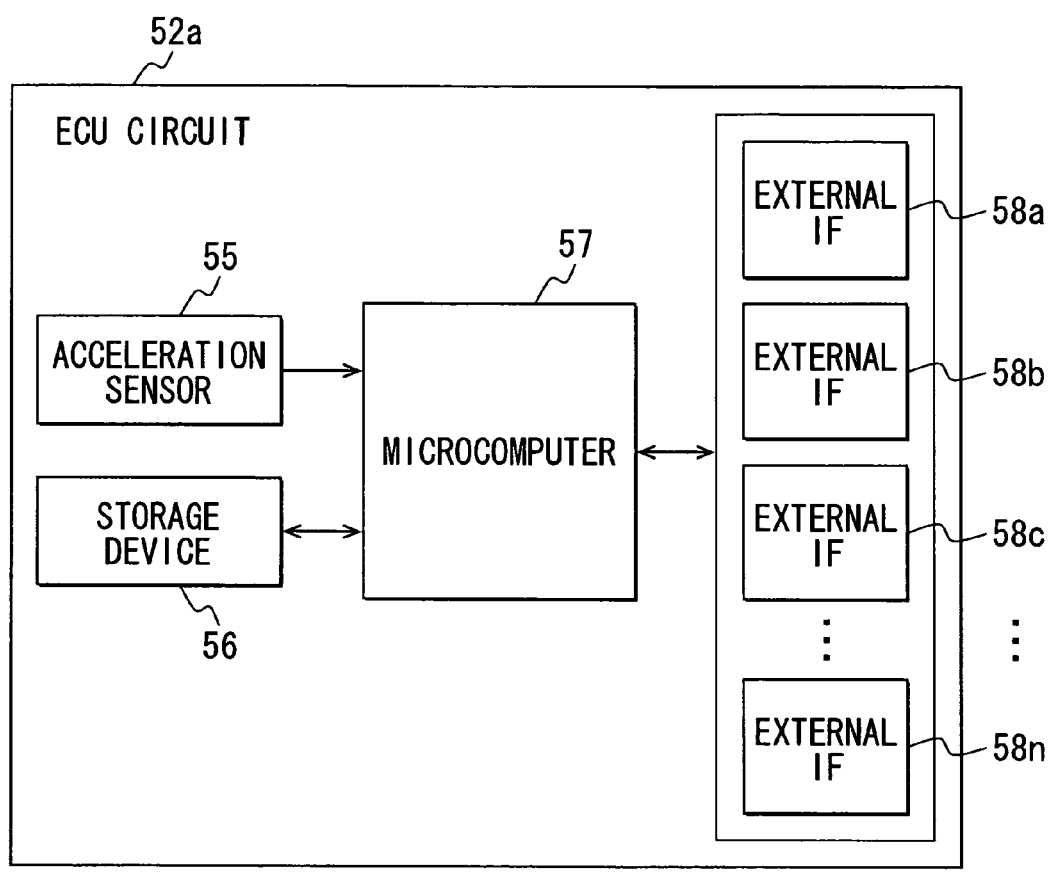
FIG. 2 is a block diagram illustrating an ECU circuit in accordance with the embodiment.

An ECU circuit 52a illustrated in FIG. 2 and configured on the control circuit board 52 includes an acceleration sensor 55, a storage device 56, a microcomputer 57, and external interfaces (IF) 58a to 58n. The acceleration sensor 55 detects acceleration of a vehicle, and the storage device 56 stores data. The acceleration sensor 55 and the storage device 56 are connected to the microcomputer 57. An air bag (not shown) or an external acceleration sensor (not shown), for example, is connected to the external interfaces (IF) 58a to 58n. If the microcomputer 57 determines that the vehicle has collided in accordance with acceleration detected by the acceleration sensor that is connected to the external IFs 58a to 58n, or by the acceleration sensor 55, the microcomputer 57 carries out control, for example, to open the air bag. Furthermore, the microcomputer 57 conducts control to store data such as information on the vehicle collision in the storage device 56.

Figure 3A:
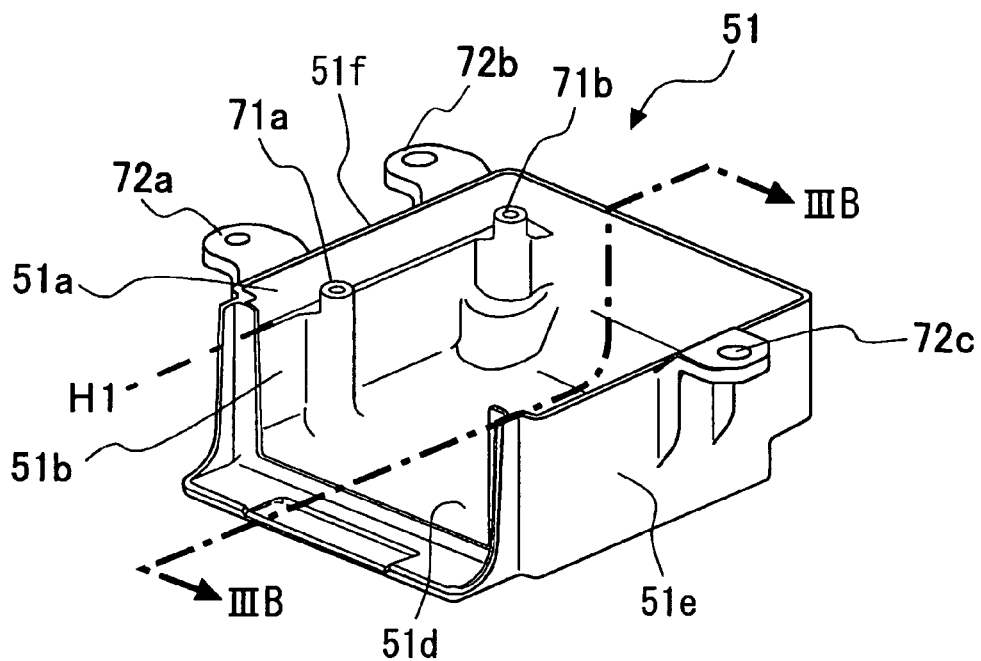
FIG. 3A is a perspective view illustrating the housing case which is a housing for an in-vehicle electronic control unit in accordance with the embodiment, with an opening of the case directed upward.
Figure 3B:
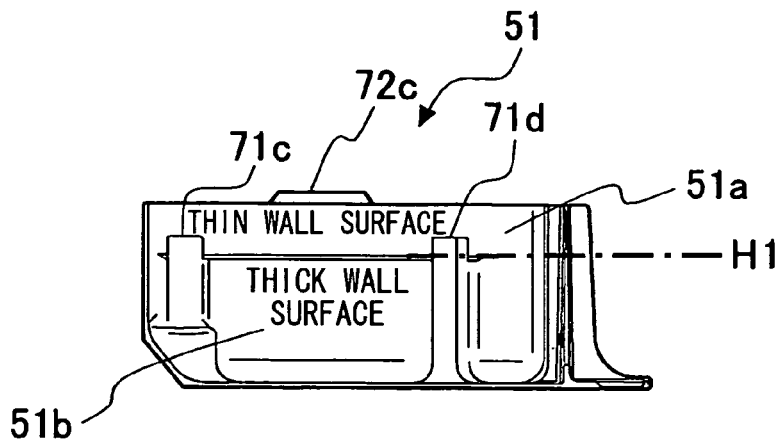
FIG. 3B is a cross-sectional view illustrating the housing case taken along a line IIIB-IIIB in FIG. 3A.

The housing case 51 is a component that features the present embodiment, and formed as illustrated in FIGS. 3A and 3B.

As shown in FIGS. 3A and 3B, board attachment portions 71a, 71b, 71c, 71d having generally cylindrical shapes are provided for two inner surfaces of the housing case 51 opposed to each other. The two attachment portions 71a, 71b are provided for one of the two inner surfaces, and the two attachment portions 71c, 71d are provided for the other one of the two inner surfaces. Two vehicle attachment portions 72a, 72b are formed on an edge of one of both the opposing side walls, for which the board attachment portions 71a to 71d are provided. The vehicle attachment portions 72a, 72b project from the one of the opposing side walls outward of the housing case 51 in a direction perpendicular to the edge. A vehicle attachment portion 72c is formed on an edge of the other one of the opposing side walls. The vehicle attachment portions 72a to 72c are formed for screwing the housing case 51 horizontally to a vehicle body therethrough, and the board attachment portions 71a to 71d are formed for screwing the control circuit board 52 horizontally to the housing case 51 therethrough.

The housing case 51 is characterized in that side walls (peripheral wall 51e) of the housing case 51 are divided into an opening side (i.e., opening end 51f-side) and a case ceiling side (i.e., covering side; ceiling wall 51d-side) of the housing case 51 with a horizontal line H1 as a boundary therebetween, and that a wall thickness of a side wall 51b on the case ceiling side is made larger than a wall thickness of a side wall 51a on the opening side. The horizontal line H1 indicates an attachment position of the control circuit board 52 to the housing case 51 through the board attachment portions 71a to 71d. Therefore, the side wall 51a is also referred to as a thin wall portion 51a, and the side wall 51b is also referred to as a thick wall portion 51b. The horizontal line H1 is also referred to as a boundary line H1. Accordingly; the peripheral wall 51e of the housing case 51 includes the thin wall portion 51a and the thick wall portion 51b. In addition, in FIG. 3A, the opening end 51f of the housing case 51 defines an opening in an imaginary plane, which is generally parallel to an installation surface 200 of the vehicle body (see FIG. 6).

Figure 4:
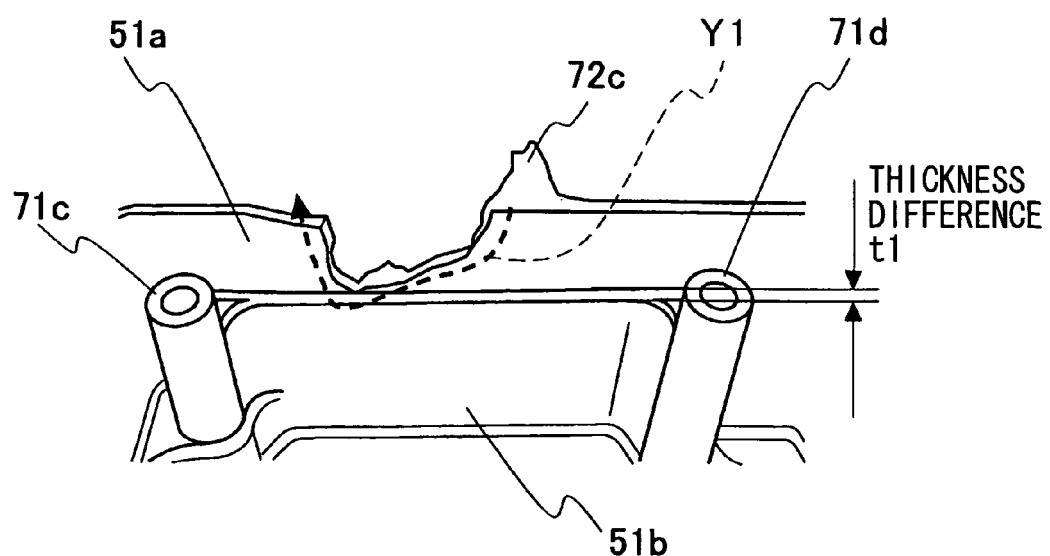
FIG. 4 is a partially perspective view illustrating a crack on the housing case in accordance with the embodiment.

By forming the housing case 51 in the above-described manner, when deformation of the vehicle in the case of the vehicle collision is transmitted to the ECU 50 so that a crack develops in the housing case 51, as illustrated in FIG. 4, for instance, a crack develops on the thin wall portion 51a of the housing case 51 which is attached to the vehicle at the vehicle attachment portions 72a to 72c. Although this crack runs over the thin wall portion 51a, it is highly possible that the crack does not spread to the thick wall portion 51b because the thick wall portion 51b has a larger wall thickness. Accordingly, the crack runs on the thin wall portion 51a, and thereby only the thin wall portion 51a is damaged as indicated by a dashed arrow Y1. Additionally, the vehicle attachment portions 72a to 72c are easily damaged, since they project from the side walls of the housing case 51 outward of the housing case 51.

Figure 11:
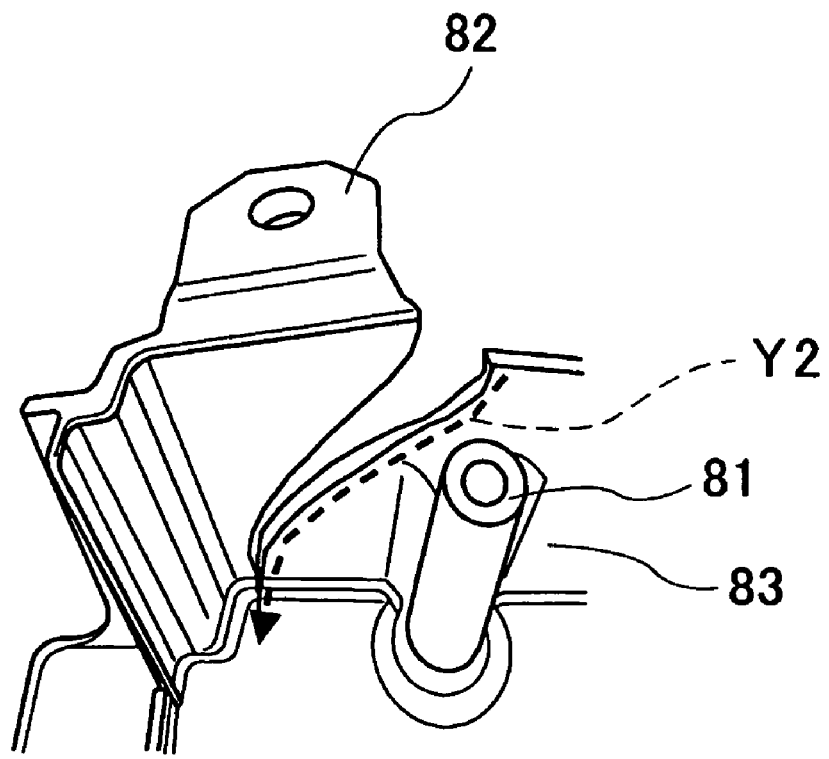
FIG. 11 is a partially perspective view illustrating a crack on a previously proposed housing case.

This phenomenon is compared with a housing case of a conventional ECU illustrated in FIG. 11, provided that a side wall 83 of the conventional housing case, on which a board attachment portion 81 and a vehicle attachment portion 82 are formed, has a uniform wall thickness. When a vehicle collides, deformation of the vehicle caused by the vehicle collision is transmitted to the ECU, so that a crack appears on the side wall 83 of the housing case as indicated by a dashed arrow Y2. Because the side wall 83 has a uniform wall thickness, this crack spreads on the side wall 83 to reach a case ceiling (covering) of the housing case, for instance. In other words, it is highly possible that the crack arrives at the side wall on a control circuit board-side, and as a result, the control circuit board is damaged.

Therefore, in the case of the construction of the housing case 51 of the present embodiment, the control circuit board 52 is mounted on the thick wall portion 51b side, and it is unlikely that the crack caused by the vehicle collision reaches the thick wall portion 51b. Consequently, the thick wall portion 51b is not damaged, so that the control circuit board 52 is protected. As a result, the housing case 51 of the present embodiment may be used for instance, for retrieving stored data at the time of the collision from the storage device 56 of the ECU 50 to conduct analysis of the collision.

The housing case 51 may be formed such that, as indicated by a numeral t1 in FIG. 4, the thick wall portion 51b projects further inward of the housing case 51 than the thin wall portion 51a. In other words, an outer surface of the side wall of the housing case 51 is made planar.

Figure 5:
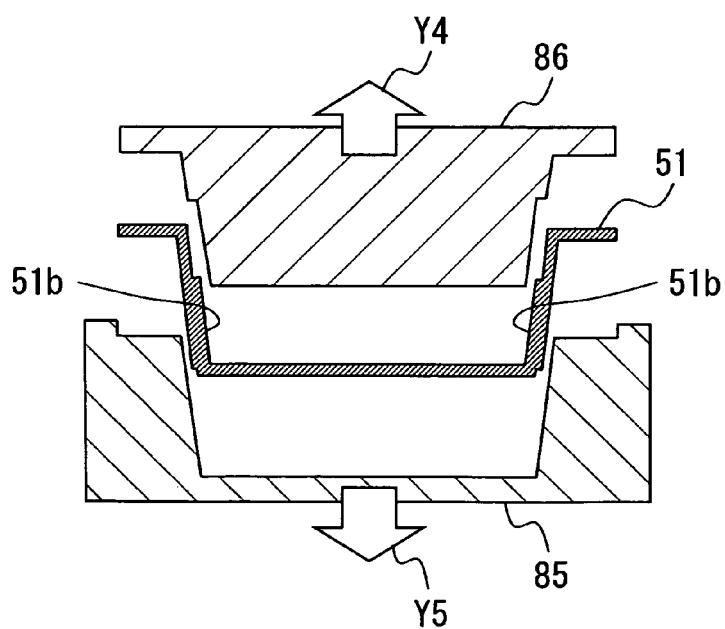
FIG. 5 is a diagram illustrating how molds are drawn from the housing case in accordance with the embodiment, when thick walls of side walls of the case project inward of the case.

When the above-described housing case 51 is molded, as shown in FIG. 5, a lower mold 85 may have flat side surfaces, and an upper mold 86 may be formed such that a side surface part of the upper mold 86 from a bottom face of the mold 86 up to a predetermined height, which is for forming the corresponding thick wall portion 51b of the housing case 51, is recessed by a thickness difference t1 shown in FIG. 4. By molding the housing case 51 using these lower and upper molds 85, 86, since the side surfaces of the lower mold 85 are flat, and side surfaces of the upper mold 86 are recessed from their bottoms up to the predetermined position, the upper mold 86 is pulled out of the housing case 51 in an upward direction Y4 and the lower mold 85 is pulled out of the case 51 in a downward direction Y5, so that it is easy to draw the molds.

Figure 9:
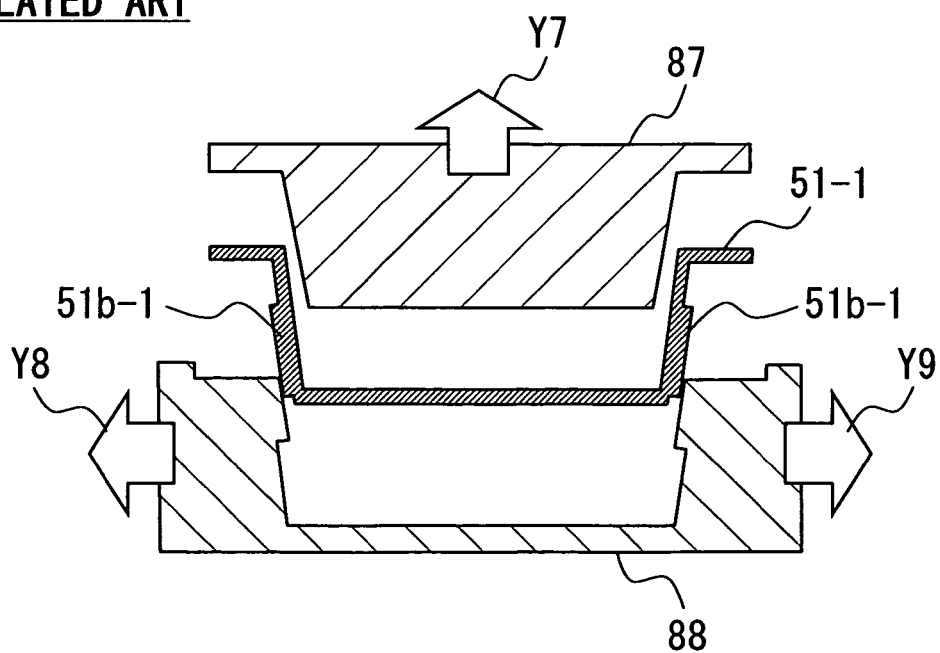
FIG. 9 is a diagram illustrating how molds are drawn from a housing case in accordance with a comparative example when thick walls of side walls of the case project outward of the case.
Figure 10:
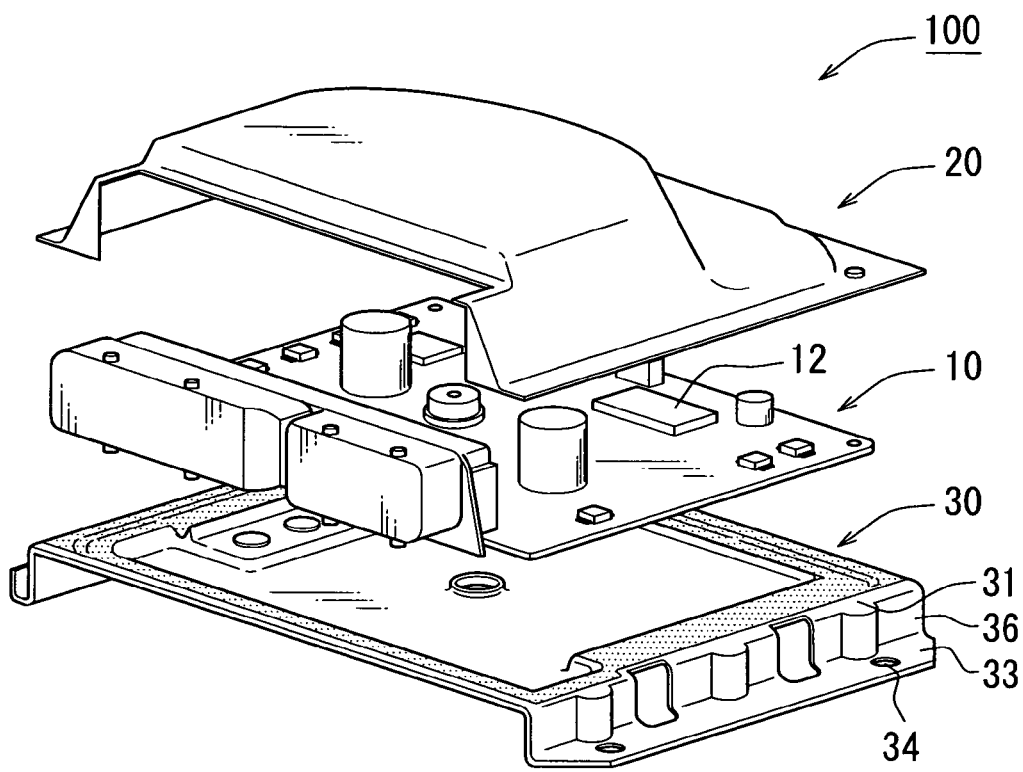
FIG. 10 is a perspective view illustrating a configuration of a previously proposed housing for an in-vehicle electronic control unit.

If an outer lateral surface 51b-1 of a housing case 51-1 is projected outward of the case 51-1 as shown in a comparative example of FIG. 9, a side surface of an upper mold 87 may be flat. However, a side surface of a lower mold 88 needs to be recessed inversely corresponding to the projection of the outer lateral surface 51b-1 from a bottom face of the mold 88 up to a predetermined height position. For this reason, the upper mold 87 is pulled out easily, but the lower mold 88 needs to be pulled in right and left directions as indicated respectively by arrows Y9, Y8, so that it is difficult to draw the molds.

Figure 6:
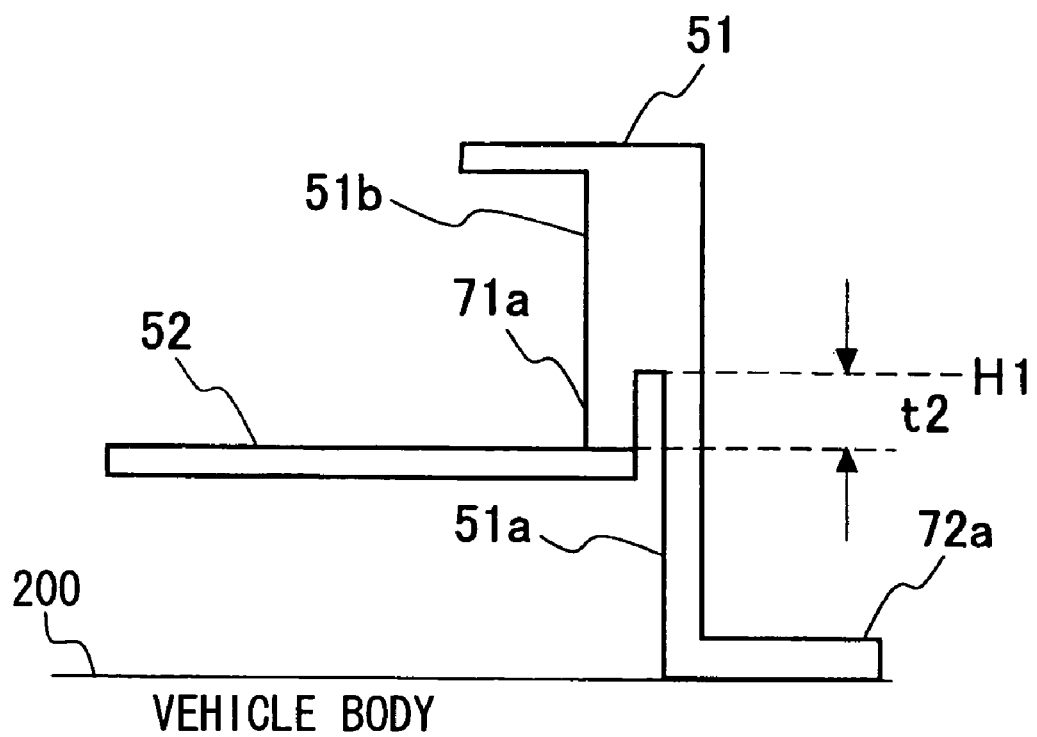
FIG. 6 is a diagram illustrating a structure of the housing case of the embodiment with a board attachment portion of the case projected toward the opening of the case.

As illustrated in a partially cross-sectional view of the housing case 51 in FIG. 6, an end portion of the board attachment portion 71a, which is formed on the boundary line H1 generally between the thin wall portion 51a and the thick wall portion 51b, may be projected toward the opening of the housing case 51 by an arbitrary length t2 with the end portion away from the thin wall portion 51a.

By forming the housing case 51 in the above-described manner, the control circuit board 52, which is fixed on the ends of these projected portions, is fixed, with the board 52 away from the side wall (thin wall portion 51a) of the housing case 51, because of projected portions of the board attachment portions 71a to 71d. Accordingly, when the thin wall portion 51a cracks by the vehicle collision, even if rain or radiator liquid, for example, enters into the housing case 51 from the crack along the wall portion 51a, they do not reach the control circuit board 52. Thus, the control circuit board 52 is protected.

Figure 7A:
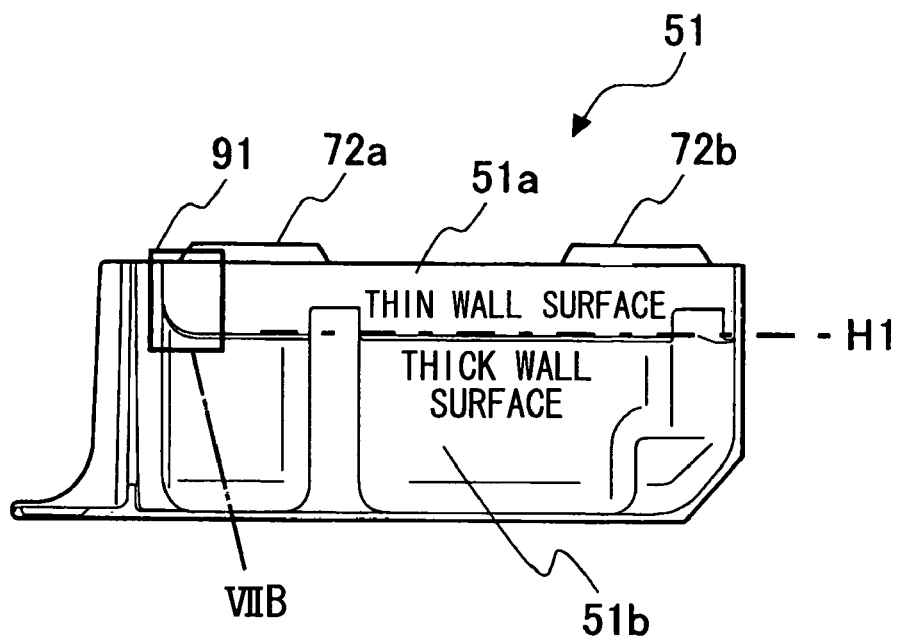
FIG. 7A is a diagram illustrating a structure of the housing case of the embodiment in which a corner part between the side walls of the case is bent.
Figure 7B:
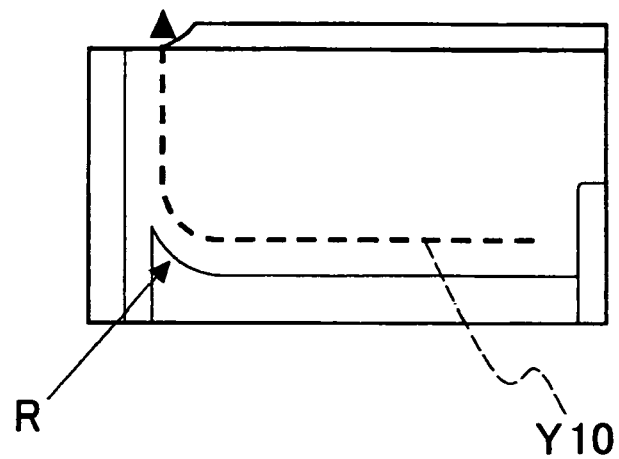
FIG. 7B is an enlarged view illustrating an area surrounded by a square 91 in FIG. 7A.

Furthermore, as illustrated in FIG. 7B, a portion within a range of a square indicated by a numeral 91 in FIG. 7A may be formed into a curved shape R. More specifically, a crossing portion between a vertical line along a corner part of the housing case 51 where the side walls of the case 51 are in contact with each other, and a horizontal line which is the boundary line H1 between the thin wall portion 51a and the thick wall portion 51b, is referred to as the curved shape R. Accordingly, if a crack, which has appeared on the thin wall portion 51a, develops to the corner part of the housing case 51 as indicated by an arrow Y10 in FIG. 7B, this crack is diverted at the portion of the curved shape R toward the opening of the housing case 51; i.e., toward the vehicle attachment portions 72a to 72c, thereby to the outside of the housing case 51. As a result, the crack does not reach the thick wall portion 51b, so that the control circuit board 52 is protected.

Figure 8:
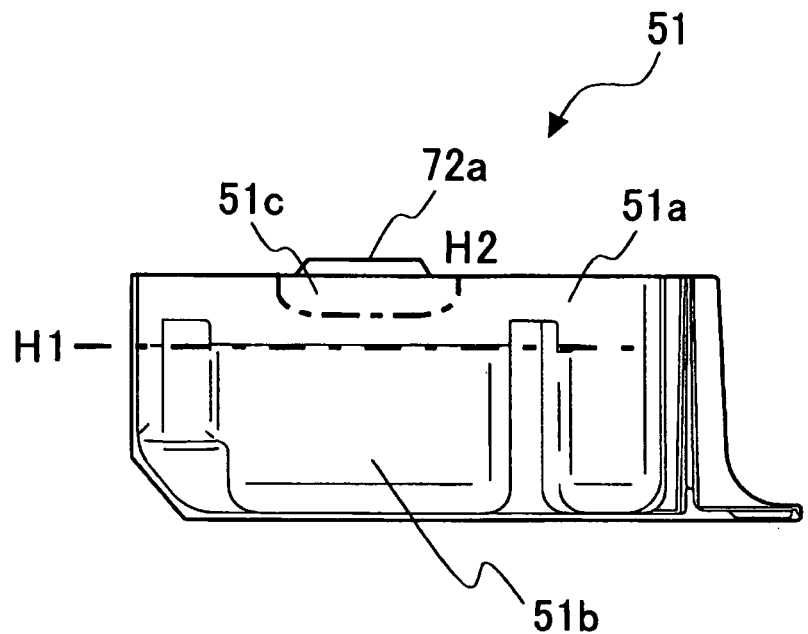
FIG. 8 is a diagram illustrating a structure of the housing case in accordance with the embodiment in which a side wall of the case around a vehicle attachment portion of the case is made even thinner than a thin wall of the case.

In addition, as shown in FIG. 8, a portion of the thin wall portion 51a around the vehicle attachment portion 72a that is attached to the edge of the opening of the thin wall portion 51a, may be an even thinner wall portion 51c. The above-described portion of the thin wall portion 51a is surrounded with a boundary line H2. In the case of this construction of the housing case 51, the even thinner wall portion 51c is destroyed at the time of the vehicle collision, so that a crack or the like does not appear on the other part of the housing case 51. Therefore, the generally entire housing case 51 is protected.

Additional advantages and modifications will readily occur to those skilled in the art. The invention in its broader terms is therefore not limited to the specific details, representative apparatus, and illustrative examples shown and described.

What is claimed is:

1. A box-shaped housing of an in-vehicle electronic control unit including a planar control circuit board that controls an occupant crash protection system, which protects an occupant of a vehicle in a case of collision of the vehicle, the box-shaped housing being installed to the vehicle and comprising:
    an opening end that defines an opening and is placed adjacent to the vehicle;
    a ceiling wall that is opposed to the opening end; and
    a peripheral wall that extends from the opening end to the ceiling wall, wherein:
    the box-shaped housing receives the planar control circuit board through the opening end toward the ceiling wall and securely holds the planar control circuit board at the peripheral wall such that a plane of the planar control circuit board is generally parallel to the opening;
    the peripheral wall includes:
        an opening side wall section that is located adjacent to the opening end; and
        a ceiling side wall section that has a wall thickness larger than a wall thickness of the opening side wall section and is located on a ceiling wall side of the opening side wall section;
    the peripheral wall further includes an attachment portion to which the control circuit board is attached; and
    the attachment portion projects toward the opening end from the ceiling side wall section by a predetermined length with the attachment portion being spaced from the opening side wall section of the peripheral wall and being substantially parallel to the opening side wall section.

2. The housing according to claim 1, wherein:
    the control circuit board is attached to the peripheral wall along a first line thereon; and
    the peripheral wall is divided into the opening side wall section and the ceiling side wall section by the first line.

3. The housing according to claim 1, wherein the ceiling side wall section has an inner surface that projects inward of the housing, and a planar outer surface.

4. The housing according to claim 1, further comprising a corner part where the peripheral wall is bent along a second line, wherein:
    the peripheral wall further includes a crossover portion where the second line crosses a first line, which is a boundary line between the opening side wall section and the ceiling side wall section; and
    the crossover portion is formed into a curved shape.

5. The housing according to claim 1, further comprising a vehicle attachment portion that is formed on an edge of the opening end and attached to the vehicle, wherein a portion of the peripheral wall around the vehicle attachment portion has a smaller thickness than the thickness of the opening side wall section.

* * * * *